United States Patent
Sugimoto (10) Patent No.: US 8,742,852 B2
(45) Date of Patent: Jun. 3, 2014

(54) OPTICAL RECEIVER COMPENSATING INPUT OFFSET

(75) Inventor: Yoshiyuki Sugimoto, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 160 days.

(21) Appl. No.: 13/462,057

(22) Filed: May 2, 2012

(65) Prior Publication Data

US 2012/0281991 A1     Nov. 8, 2012

(30) Foreign Application Priority Data

May 6, 2011    (JP) ................................ 2011-103477

(51) Int. Cl.
*H03F 3/08*    (2006.01)

(52) U.S. Cl.
USPC ............................... 330/308; 330/9; 330/252

(58) Field of Classification Search
USPC ............................................ 330/308, 9, 252
See application file for complete search history.

(56) References Cited

U.S. PATENT DOCUMENTS

| | | | | |
|---|---|---|---|---|
| 5,025,456 A | * | 6/1991 | Ota et al. | 375/318 |
| 5,430,765 A | * | 7/1995 | Nagahori | 375/318 |
| 6,456,141 B1 | * | 9/2002 | Nishizono et al. | 327/345 |
| 6,552,605 B1 | * | 4/2003 | Yoon | 330/9 |
| 7,123,098 B2 | * | 10/2006 | Bae et al. | 330/308 |
| 7,405,386 B2 | * | 7/2008 | Shimizu et al. | 250/214 R |
| 2011/0228280 A1 | * | 9/2011 | Schmitt et al. | 356/479 |

FOREIGN PATENT DOCUMENTS

| | | |
|---|---|---|
| JP | 7-240640 | 9/1995 |
| JP | 2003-168933 | 6/2003 |
| JP | 2003-264437 | 9/2003 |
| JP | 2010-278753 | 12/2010 |
| JP | 2011-205320 | 10/2011 |

* cited by examiner

*Primary Examiner* — Patricia Nguyen (74) *Attorney, Agent, or Firm* — Smith, Gambrell & Russell, LLP (57) ABSTRACT

A differential amplifier capable of canceling an input offset current and expanding a linearly operating range is disclosed. The differential amplifier, which is preferably applicable to an optical receiver to convert a photocurrent into a voltage signal, includes a trans-impedance amplifier and an offset canceller that detects output offset and extracts input current to cancel the output offset. Moreover, the extracted input current traces the average level of the input voltage to widen the linearly operating range of the trans-impedance amplifier.

13 Claims, 11 Drawing Sheets

OPTICAL RECEIVER COMPENSATING INPUT OFFSET

BACKGROUND OF THE INVENTION

1. Field of the Invention

The present invention relates to an optical receiver, in particular, the invention relates to an optical receiver than may compensate an input offset.

2. Background

A differential trans-impedance amplifier (hereafter denoted as TIA) with an offset canceller has been known in the field. A Japanese Patent Application published as JP-2003-168933A has discloses a differential circuit to suppress an input offset by detecting an output offset and feeding the detected offset back to an inter stage of the amplifier to cancel the output offset.

Another Japanese Patent Application published as JP-2003-264437A has disclosed an optical receiver to cancel an output offset of a front end amplifier by detecting peak signal input therein. A Japanese Patent Application published as 2010-278753A has disclosed a differential amplifier that detects an input offset through an average thereof, and extracts a current corresponding to the input offset from a current flowing in the output load to cancel the output offset. Still another Japanese Patent Application published as JP-H07-240640 has disclosed another differential amplifier to balance the input bias current by filtering the outputs of the amplifier.

SUMMARY OF THE INVENTION

One aspect of the present invention relates to an optical receiver that comprises a pair of photodiodes (hereafter denoted as PD), a differential trans-impedance amplifier and an offset canceller. The PDs may receive a pair of optical signals complementary to each other and generate a pair of photocurrents that inherently accompany with an offset current. The differential TIA may convert the photocurrents into a pair of voltage signals. The offset canceller includes a current extractor that receives the voltage signal output from the differential TIA and shunt a portion of the photocurrents to cancel an output offset appeared in the voltage signals output from the differential TIA.

The optical receiver of an embodiment of the invention may shunt or extract a potion of the photocurrents input to the differential TIA by the current extractor, which receives the outputs of the differential TIA, so as to cancel the output offset of the differential TIA.

The current extractor of an embodiment may further include an average detector that may detect an average of input signals attributed to the photocurrents. Moreover, the magnitude of the extraction may depend on the average of the input signals. Accordingly, the differential TIA, in particular, the front stage thereof to amplify the input signals, may expand a range of a linearly operable range.

Another aspect of the invention relates to an amplifier that comprises a differential TIA, and an offset canceller. The differential TIA may provide a pair of input terminals and a pair of output terminals, while, the offset canceller may also provide a pair of input terminals and a pair of output terminals, where each of paired terminals of the offset canceller may be reversely connected to each of paired terminals of the differential TIA. The offset canceller may shunt or extract a portion of currents input to the input terminals of the differential TIA so as to cancel an offset appeared between the output terminals of the differential TIA.

The offset canceller may further include an average detector to detect an average of input signals input to the input terminals of the differential TIA. The amplifier of the embodiment may adjust a range of the shunting or extracting the portion of the input currents depending on the average of the input signals.

BRIEF DESCRIPTION OF THE DRAWINGS

These and other aspects of the invention may be understood by reference to the following detailed description, taken in conjunction with the accompanying drawings, wherein:

FIG. 11 is a circuit diagram to detect an average level of the input signals according to still another embodiment of the invention.

DESCRIPTION OF PREFERRED EMBODIMENTS

Comparative examples will be first described to compare them with embodiments according to the present invention. In a optical communication system implementing with the digital coherent technology, such as Dual Polarization Quadrature Phase Shift Keying (DP-QPSK) system, an optical receiver provides an optical pre-processing system called as an optical hybrid in the front end of the transducer comprising an optical receiving device such as a photodiode (PD) and a trans-impedance amplifier (TIA) to convert a phase modulated optical signal into another signal modulated in an amplitude thereof. The optical signal entering the pre-processor above described may be converted into a pair of signals with a positive phase PIN and a negative phase /PIN complementary to each other. The character "/" added placed in the front end of the context means that the parameter denoted by the context has a phase reversed to the same parameter but without "/". Two PD's each connecting in parallel to the TIA to constitute the optical receiver of the differential type may be applicable to maximize the signal-to-noise ratio (S/N ratio) of the converted electrical signal.

Figure 1:
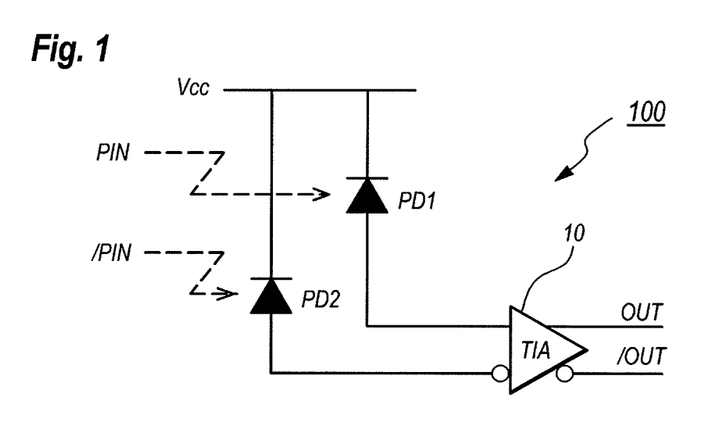
FIG. 1 shows a fundamental circuit of an optical receiver applicable to a pair of optical signals complementary to each other.

An comparative example of the optical receiver 100 will be explained as referring to FIG. 1, which is a circuit diagram of the optical receiver 100 comprising a pair of PDs, $PD_1$ and PD$_2$, and a TIA 10 whose input terminals are connected to respective PDs, PD$_1$ and PD$_2$. The cathode of the PDs, PD$_1$ and PD$_2$, are biased by the power supply Vcc to receive optical signals, PIN and /PIN. Each of the PDs, PD$_1$ and PD$_2$, may generate a photocurrent complementary to each other depending on the optical signal, PIN and/PIN, input thereto. The TIA 10 may convert these photocurrents into respective voltage signals to output from the output terminals, OUT and /OUT. The optical receiver shown 100 in FIG. 1 sometimes causes a large offset between two output terminals, OUT and /OUT, because of an unbalance between optical signals output from the optical hybrid, uneven sensitivity between two PDs, PD$_1$ and PD$_2$, and so on.

Figure 2:
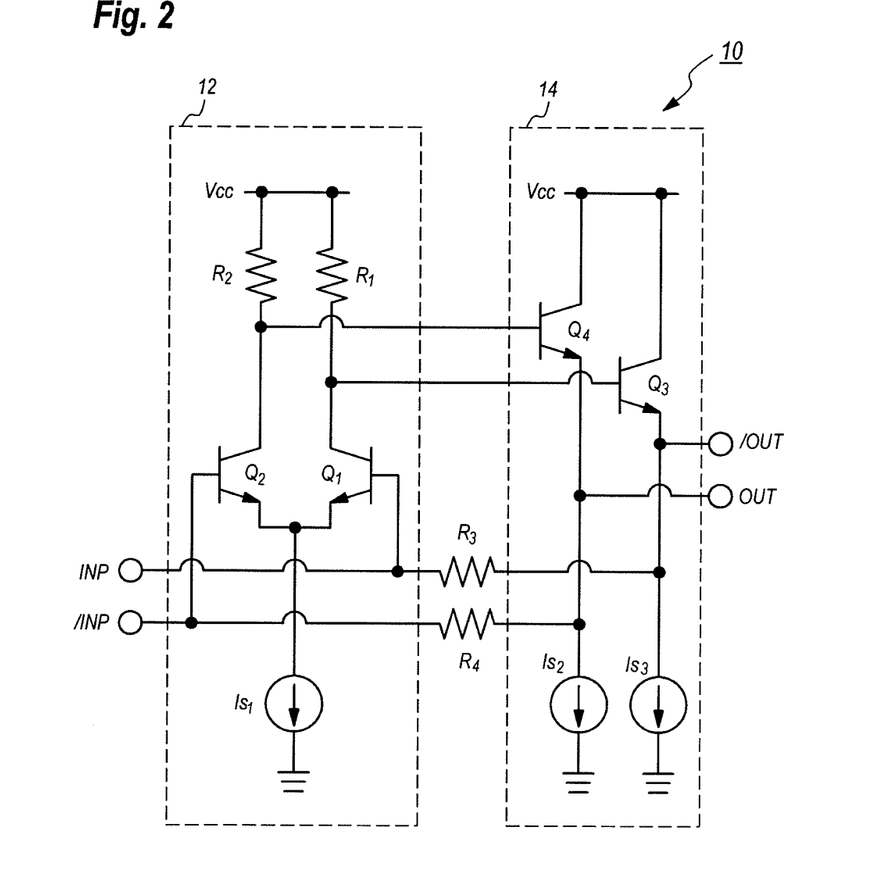
FIG. 2 is a circuit diagram of a fundamental differential trans-impedance amplifier.

FIG. 2 shows a typical circuit diagram of the TIA 10 in a comparative example. The TIA 10 shown in FIG. 2 provides two input terminals, INP and /INP, two output terminals, OUT and /OUT, a differential circuit 12, an emitter follower 14, and two feedback resistors, R$_3$ and R$_4$. Each of Two input terminals, INP and /INP, receives a current signal complementary to each other; while, each of two output terminals, OUT and /OUT, may output a voltage signal also complementary to each other, namely, the positive phase voltage and the negative phase voltage.

The differential circuit 12 includes two transistors, Q$_1$ and Q$_2$, two resistors, R$_1$ and R$_2$, and a current source Is$_1$. Each of the base of the transistors, Q$_1$ and Q$_2$, is connected to respective input terminals, INP and /INP, to receive the complementary current signals. Each of the emitter of the transistors, Q$_1$ and Q$_2$, is commonly grounded via the current source Is$_1$, while, the collector of the first transistor Q$_1$ is biased by the power supply Vcc via the load resistor R$_1$; while, the collector of the other transistor Q$_2$ is biased via the second resistor R$_2$.

The emitter follower 14 includes two transistors, Q$_3$ and Q$_4$, and two current sources, Is$_2$ and Is$_3$. The third transistor Q$_3$ in the base thereof is connected to the collector of the first transistor Q$_1$, the emitter thereof is not only coupled with one of the output terminals but grounded via the current source Is$_3$, OUT, and the collector thereof is directly biased by the power supply. While, the fourth transistor Q$_4$ in the base thereof is connected with the collector of the second transistor Q$_2$, the emitter thereof is not only coupled with the other of the output terminals /OUT but grounded via the second current source Is$_2$, and the collector thereof is directly biased by the power supply Vcc. Each of the feedback resistors, R$_3$ and R$_4$, is connected between the input terminal INP and the output terminal /OUT, or between the other of input terminals, /INP and the other of output terminals, OUT.

The TIA 10 of in FIG. 2 inherently shows an output offset between the output terminals, OUT and /OUT, because of the unbalance between the optical signals each entering the PDs, PD$_1$ and PD$_2$, the uneven optical sensitivity between two PDs, PD$_1$ and PD$_2$, the scattered characteristics in circuit elements in the TIA 10, and so on. An offset canceller for the inputs and/or the outputs of the TIA 10 or a circuit including the TIA 10 as a pre-amplifier is preferably necessary.

Figure 3:
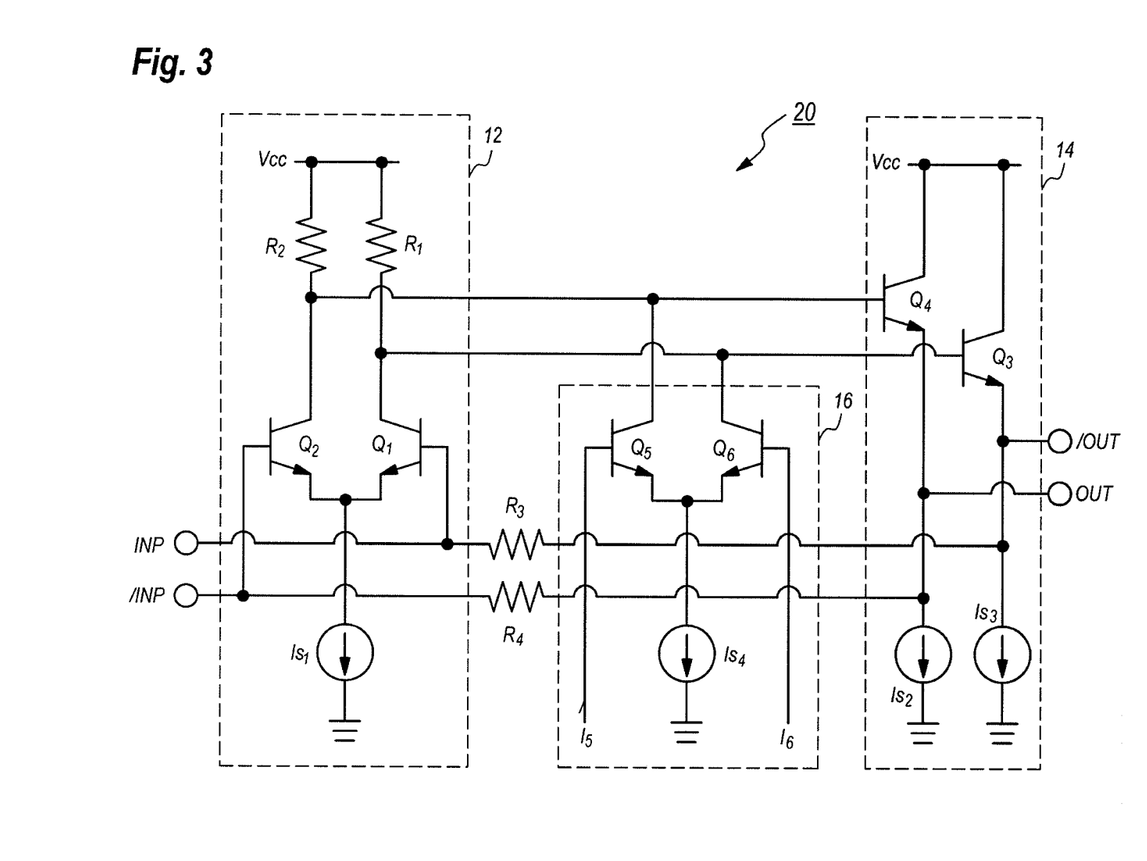
FIG. 3 is a circuit diagram of a TIA implementing with a conventional offset canceller.

An example of the offset canceller implemented within a TIA will be described as referring to FIG. 3. FIG. 3 shows a circuit diagram of a TIA 20 including the offset canceller, where the TIA 20, comparing with the comparative example shown in FIG. 2, adds another differential circuit 16 as the offset canceller, which includes two transistors, Q$_5$ and Q$_6$, and the current source Is$_4$. The transistors, Q$_5$ and Q$_6$, may receive the output offset, I$_5$ and I$_6$, in the base thereof.

The differential circuit 16 may operate to balance the collector level of two transistors, Q$_5$ and Q$_6$. However, when the input signals provided in the terminals, INP and /INP, inherently have a large unbalance, or the sensitivity between two PDs, PD$_1$ and PD$_2$, becomes large, the offset canceller 16 may not compensate such a large offset and the paired transistors, Q$_1$ and Q$_2$, are forced to operate in an unbalanced condition, which narrows a range of input currents where the TIA 20 may linearly operate.

Figure 4:
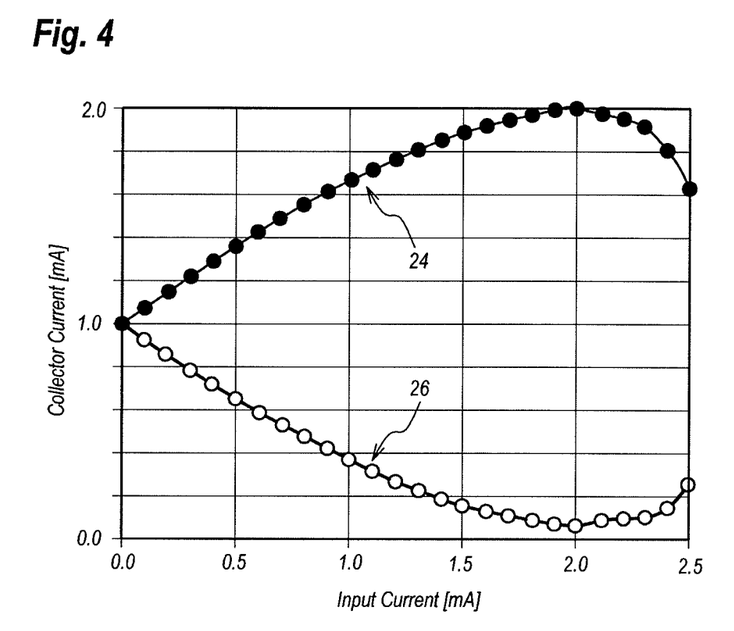
FIG. 4 shows typical behaviors of output collector currents without compensating an offset thereof.

FIG. 4 shows simulation results of the output offsets of the comparative TIA 20 shown in FIG. 3. The horizontal axis in FIG. 4 corresponds to the input current to the TIA 20, while, the vertical axis shows the collector current of the transistors, Q$_1$ and Q$_2$. The simulation assumes that the input offset of 20% with respect to the average thereof, that is, one of the input terminal INP receives the current of +10%, while, the other input terminal /INP receives the current of -10% with respect to their average. The simulation further assumes that the signals, I$_5$ and I$_6$, to compensate the offset are fed back from the output terminals, OUT and /OUT. The collector current shown in FIG. 4 is normalized such that the maximum thereof becomes 2 mA.

Behavior 24 connecting solid circles in FIG. 4 corresponds to the collector current of the transistor Q$_1$, while, another behavior 26 connecting open circles corresponds to the collector current of the other transistor Q$_2$. As shown in FIG. 4, the input offset expands the offset in the collector currents, 24 and 26. The offset canceller 16 operates to compensate the output offset, namely, to absorb the difference between the level of two outputs, OUT and /OUT, to flow an excess current in the transistors, Q$_5$ and Q$_6$, of the offset canceller 16. However, the currents flowing in respective transistors, Q$_1$ and Q$_2$, are left unbalance. Accordingly, the difference between the collector currents, 24 and 26, shown in FIG. 4 becomes large as the input offset expands. Only one of transistors, Q$_1$ and Q$_2$, may flow the current therein at the input current is around 2 mA, which increases the output distortion.

The comparative example will be further explained by referring to FIG. 2 again. When the input terminals, INP and /INP, each receives the input current Iin and /Iin, the average of the input level Vin may be given by:

$$Vin = Vcc - RL \times (I_1/2) - Vbe + Iin \times RF, \quad (1)$$

where RL, I$_1$, Vcc, and Vbe are the resistance of the load resistors, R$_1$ and R$_2$, the current of the current source Is$_1$, voltage of the power supply Vcc, and the base-emitter voltage of the transistor, Q$_3$ and Q$_4$, respectively. According to equation (1), the input voltage Vin, which is the base level of the transistor, Q$_1$ and Q$_2$, increases in proportional to the input current Iin. While, the collector level Vc of the transistors, Q$_1$ and Q$_2$, is given by:

$$Vc = Vcc - RL \times (I_1/2). \quad (2)$$

That is, the collector level Vc is independent of the input current Iin and the input voltage Vin. Then, increasing the input current Iin, which raises the input voltage Vin, the collector-emitter bias Vce of the transistor, Q$_1$ and Q$_2$, becomes smaller to make them unstable.

Figure 5:
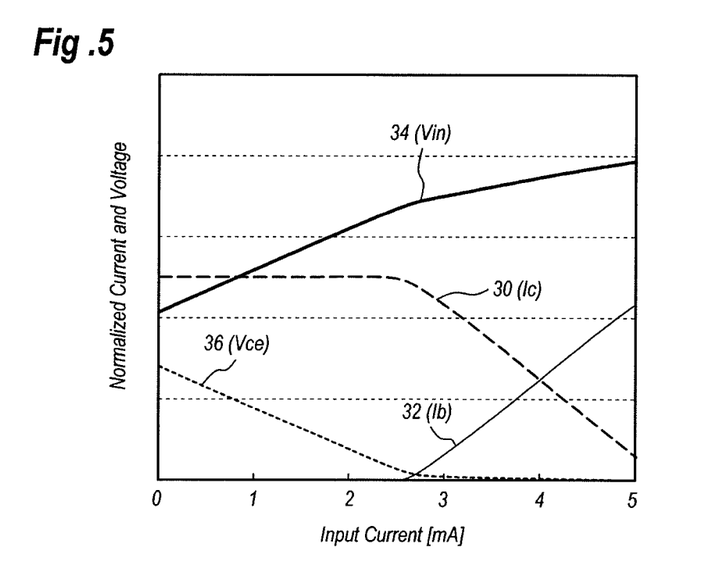
FIG. 5 shows behaviors of a collector current, a base current, an input voltage, and a collector bias of one of transistors of the differential circuit depending on the input current.

FIG. 5 shows operating conditions of the transistor, Q$_1$ and Q$_2$, as the input current Iin varies. The broken line 30 and the sold line 32 correspond to the collector current Ic and the base bias current Ib, respectively; while, the bold line 34 and the dotted line 36 show the change of the input voltage Vin and the collector-emitter bias Vce of the transistor, respectively.

When two inputs of the differential amplifier 12 uniformly vary, the input voltage Vin increase as the bias current Iin increases. When the input current Iin exceeds about 2.5 mA, the base current Ib begins to flow in the transistor, Q$_1$ and Q$_2$, and the slope of the input voltage Vin becomes moderate as shown by the bold line 34. In a region where the base current Ib is less than 2.5 mA, nearly a half of the current I$_1$ flowing in the current source $Is_1$ flows in the transistor, $Q_1$ and $Q_2$ as the collector current Ic denoted by the broken line 30 because the base current Ib may be ignorable compared with the current $I_1$. However, exceeding the input current Iin over about 2.5 mA, which means that the current source $Is_1$ must absorb the increase of the base current Ib, the collector current Ic decreases as shown by the broken line 30, and the collector-emitter bias Vice becomes substantially zero, which means that the transistor, $Q_1$ and $Q_2$, no longer shows the amplifying function.

Thus, the offset compensation, or the offset cancellation, is unavoidable in an amplifier applicable to an optical receiver. Moreover, a wide dynamic range is also required for the amplifier. Next, embodiments according to the present invention to give solutions for subjects above mentioned will be described as referring to the drawings.

(First Embodiment)

Figure 6:
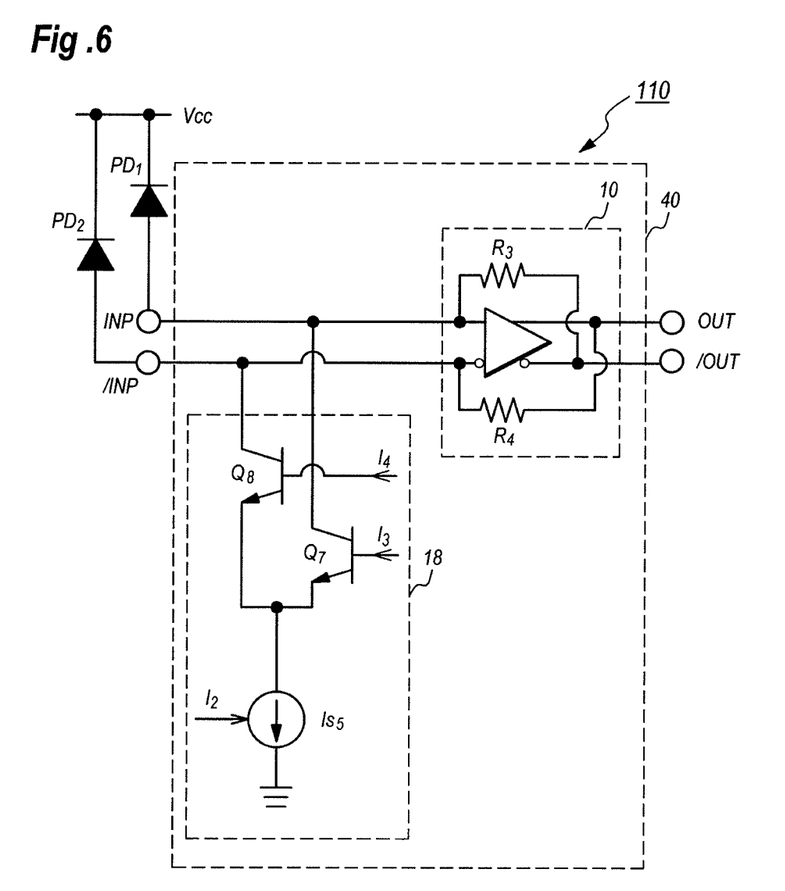
FIG. 6 shows a circuit diagram of the TIA implementing with an input current extractor.

FIG. 6 shows a circuit diagram of an optical receiver 110 according to the first embodiment of the invention, where the optical receiver 110 implements an offset canceller 18. The optical receiver 110 includes, as those of the comparative example shown in FIG. 1, a pre-amplifier 40, and two PDs, $PD_1$ and $PD_2$. The pre-amplifier 40 includes the TIA 10, details of which are shown in FIG. 2, and a current extractor 18 that comprises two transistors, $Q_7$ and $Q_8$, and a current source $Is_5$. The current extractor 18 may operate as an offset canceller.

The paired transistors, $Q_7$ and $Q_8$, are connected in the input of the TIA 10. Specifically, the collector of the transistors, $Q_7$ and $Q_8$, is connected to respective input terminals, INP and /INP; while, the emitter thereof is commonly connected to the current source $Is_5$. Each of the bases of the transistors, $Q_7$ and $Q_8$, may receive the signal, $I_3$ and $I_4$, to cancel the input offset. The current flowing in the current source $Is_5$, which is a sum of two currents each flowing in respective transistors, $Q_7$ and $Q_8$, may be adjusted by the control signal $I_2$ which is proportional to the sum of two input signals applied to the terminals, INP and /INP. According to the current extractor 18 shown in FIG. 6 may cancel the input offset of the TIA 10, which may suppress the unbalance of the differential circuit current for the TIA 10.

Figure 7:
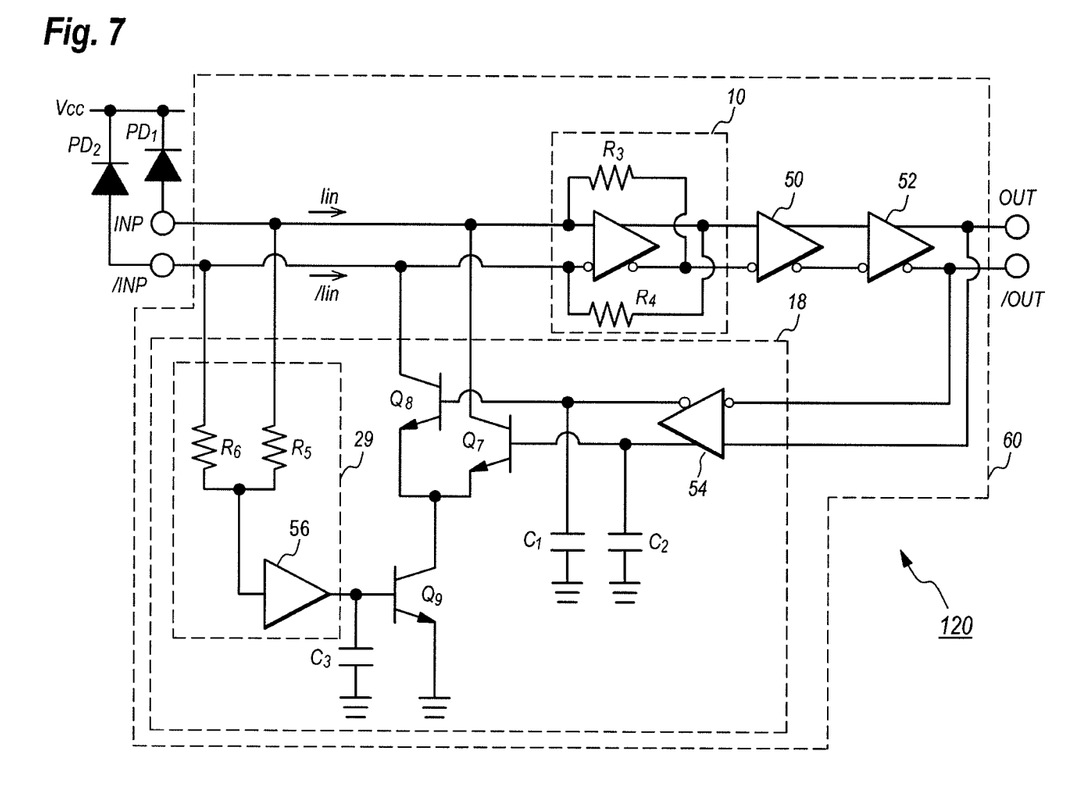
FIG. 7 shows a circuit diagram of an optical receiver with an offset canceller according to an embodiment of the invention.

The operation of the optical receiver 110 with the current extractor 18 according to the embodiment will be specifically described as referring to FIG. 7 which is a circuit diagram of the optical receiver 120. As shown in FIG. 7, the optical receiver 120 includes the pre-amplifier 60, and two PDs, $PD_1$ and $PD_2$. The pre-amplifier 60 includes the TIA 10, a plurality of amplifiers, 50 and 52, and an offset canceller 18. One of pre-amplifiers 50 may be, for instance, a limiting amplifier to amplify the output of the TIA 10 but limit the output amplitude thereof. The other of the amplifiers 52 may operate as an output buffer to drive the output terminals, OUT and /OUT, and the offset canceller 18.

The offset canceller 18 includes a differential amplifier 54, two capacitors, $C_1$ and $C_2$, two transistors, $Q_7$ and $Q_8$, a current source $Q_9$, and a current adjustor 29 including two resistors, $R_5$ and $R_6$, a buffer 56, and a capacitor $C_3$. The differential amplifier 54 may feed the outputs, OUT and /OUT, back to the paired transistors, $Q_7$ and $Q_8$. The capacitors, $C_1$ and $C_2$, may eliminate noise, in particular, high frequency components thereof involved in the output of the amplifier 54. The operation of the paired transistors, $Q_7$ and $Q_8$, as the current extractor is same as those described in FIG. 6.

The transistor $Q_9$ may operate as the current source $Is_5$ shown in FIG. 6, and the magnitude of the current may be determined by the average of the input signals detected via the resistors, $R_5$ and $R_6$. The amplifier 56 with the high input impedance is set in the downstream of the resistors, $R_5$ and $R_6$, to prevent the input impedance of the transistor $Q_9$ from influencing the input signals provided to the input terminals, INP and /INP. The capacitor $C_3$ may integrate the output of the buffer 56; that is, only the average of the input signals may be transferred to the transistor $Q_9$. Thus, the collector current flowing in the transistor $Q_9$ may be determined by the average of the input signals.

When the average of the input signals detected via two resistors, $R_5$ and $R_6$, increases, the collector current of the transistor $Q_9$, and that of the paired transistors, $Q_7$ and $Q_8$, increase. That is, a portion of the input currents, Iin and /Iin, is shunted to the paired transistors, $Q_7$ and $Q_8$, which may suppress the increase of the average of the input levels to reduce the decrease of the linearly operable range of the TIA 10.

Figure 8:
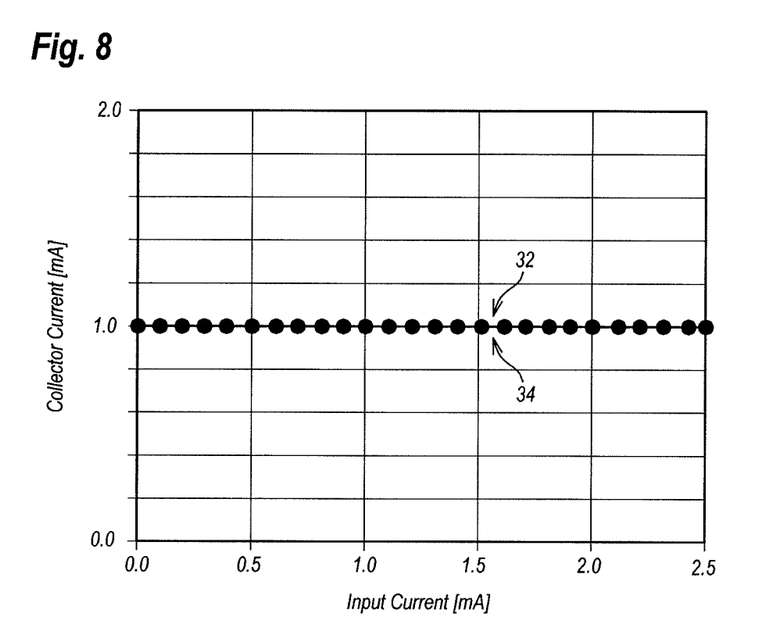
FIG. 8 shows behaviors of the collector current of a paired transistors provided in the front stage of the TIA.

FIG. 8 shows a result of the output offset current observed in respective collector of the paired transistors, $Q_1$ and $Q_2$, of the TIA 10 against the input current. The offset condition for the input current, Iin and /Iin, is the same as those described in FIG. 4, and the collector current in the vertical axis is normalized in the maximum thereof equal to 2 mA. Solid lines, 32 and 34, appeared in FIG. 8 which connects the filled circles and fully overlapped correspond to the collector current of the transistors, $Q_1$ and $Q_2$, respectively. As observed in FIG. 8, the collector current of the transistors, $Q_1$ and $Q_2$, becomes substantially constant even the input currents, Iin and /Iin, show a substantial offset. Thus, even when the input currents of the differential circuit inherently accompany a large offset, the increase of the input level, namely, the average of two inputs may be suppressed and the output offset may be cancelled.

Figure 9:
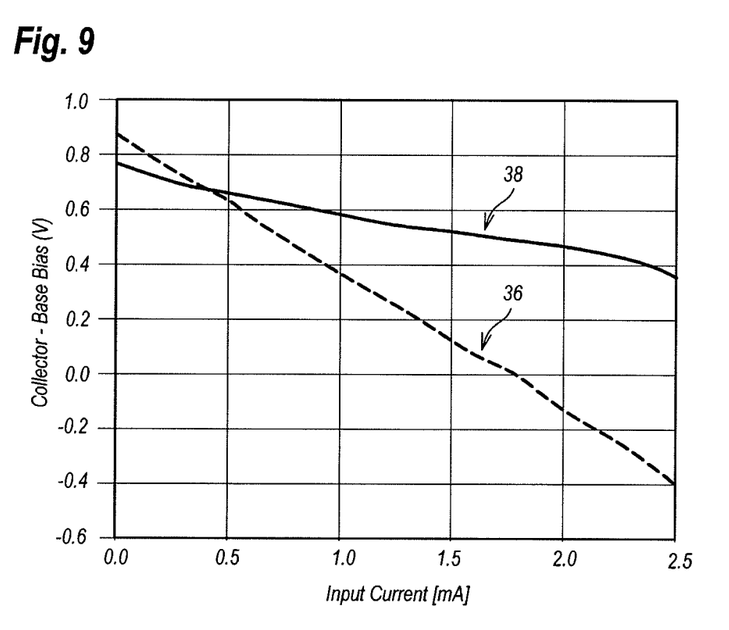
FIG. 9 shows behaviors of the collector to base bias of the paired transistors in the front stage of the TIA with or without the current extractor according to the present invention.

The operating conditions of the paired transistors, $Q_1$ and $Q_2$, will be analyzed. FIG. 9 shows the collector-base bias of those transistors, $Q_1$ and $Q_2$, against the input currents, Iin and /Iin. Solid line 38 shows the base-collector bias of the transistor, $Q_1$ or $Q_2$, in the pre-amplifier 60 with the offset canceller 18 shown in FIG. 7; while, the broken line 36 corresponds to a condition where the offset canceller 18 is removed from the pre-amplifier 60. As shown in FIG. 9, the offset canceller 18 may moderate the decrease of the base-collector bias in the paired transistors, $Q_1$ and $Q_2$. Increasing the input currents, Iin and /Iin, the base-collector bias of the transistors, $Q_1$ and $Q_2$, becomes negative for the pre-amplifier 60 without offset canceller 18, which means that the collector level becomes less than the base level to turn on the transistor, $Q_1$ or $Q_2$, completely. In such a condition, the transistor is unable to amplify an input signal.

According to the embodiments thus described, the pre-amplifier 60 includes the TIA 10 and the offset canceller 18. The TIA 10 may convert input currents complementary to each other into the output voltages also complementary to each other. The offset canceller 18 is a differential circuit to receive the outputs of the TIA 10 and to provide outputs thereof to the inputs of the TIA 10 to cancel the input offset of the TIA 10. Moreover, the offset cancellation by the offset canceller 18 depends on the average of the input signals by feeding the average of the inputs to the current source of the differential circuit.

According to the embodiments thus described, the differential circuit in the offset canceller 18 includes a pair of transistors, $Q_7$ and $Q_8$, whose collector is connected to respective input terminals of the pre-amplifier 60 in the arrangement of, what is called, the open collector connection. The TIA 10 has the conventional arrangement such as those shown in FIG. 2; specifically, the TIA 10 includes the differential circuit 12, a emitter follower 14 to receive the output of the differential circuit 12, and a pair of resistors, $R_3$ and $R_4$, to feed the output of the emitter follower 14 back to respective inputs of the differential circuit 12.

The pre-amplifier, 40 or 60, may connect two PDs, $PD_1$ and $PD_2$, to the input terminals, INP and /INP, to configure the optical receiver, 110 or 120, as shown in FIGS. 6 and 7. Two PDs, $PD_1$ and $PD_2$, may generate and provide photocurrents complementary to each other in the input terminals, INP and /INP, by responding optical signals also complementary to each other. The TIA 10 may convert these photocurrents into voltage signals also complementary to each other.

Figure 10:
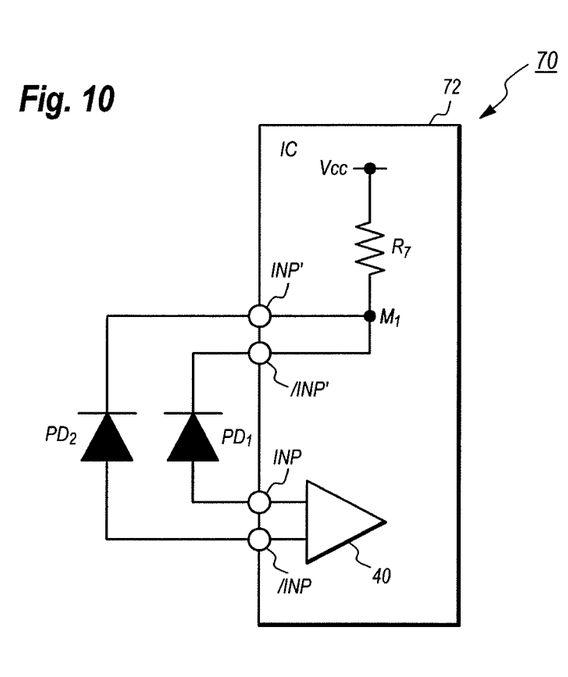
FIG. 10 is a circuit diagram to detect an average level of the input signals complementary to each other according to a modified example of the invention.

According to the embodiments, the input voltage signals appeared at the terminals, INP and /INP, may be detected in the average thereof through the resistors, $R_5$ and $R_6$. Another circuit shown in FIG. 10 may detect the average input level. The optical receiver 70 shown in FIG. 10 includes an integrated circuit (IC) 72 and a pair of PDs, $PD_1$ and $PD_2$. The IC 72 provides two pairs of input terminals, INP and /INP, and INP' and /INP', respectively. The TIA 40 implemented within the IC 70 may receive photocurrents via one of paired input terminals, INP and /INP; while, the other of paired input terminals, INP' and /INP', are commonly connected to the power supply Vcc via a resistor $R_7$. Two PDs, $PD_1$ and $PD_2$, are each connected between input terminals, INP and /INP'; and, /INP and INP', respectively. The resistor $R_7$ may flow a sum of currents each generated in PDs, $PD_1$ and $PD_2$. Thus, detecting the level of the node $M_1$, and feeding this level back to the offset canceller shown in FIG. 7 to adjust the extracting current flowing in the source transistor $Q_9$, the linear operating range of the TIA 10 may also expand.

Still another circuit to detect an average of the input for the differential amplifier will be described as referring to FIG. 11, which is modified from the TIA 10 shown in FIG. 2. The modified TIA 11 has an emitter follower 15 distinguishable from the emitter follower 14 in the aforementioned TIA 10 in FIG. 2. That is, the transistors, $Q_3$ and $Q_4$, in the emitter follower 15 are commonly biased in the collector thereof by the power supply Vcc via a resistor $R_8$. When the sum of the input currents flowing into the terminals, INP and /INP, increases, the input currents flows into respective current sources, $Is_2$ and $Is_3$, through the resistors, $R_3$ and $R_4$, which decreases the collector currents of the transistors, $Q_3$ and $Q_4$; then, a voltage drop caused in the resistor $R_6$ by the collector currents becomes small and the level of the node $M_2$ rises. That is, the average input current may be detected as the level of the node $M_2$. Accordingly, feeding the level of the node $M_2$ back to the source transistor $Q_9$ of the offset canceller 18, the linearly operating range of the TIA 10 may be expanded.

In view of the many possible embodiments, it will be recognized that the illustrated embodiments include only examples and should not be taken as a limitation on the scope of the invention. Rather, the invention is defined by the following claims. Therefore, I claim as the invention all such embodiments that come within the scope of these claims.

What is claimed is:

1. An optical receiver, comprising:
a pair of photodiodes configured to receive a pair of optical signals and to generate a pair of photocurrents including an offset current;
a differential trans-impedance amplifier configured to convert the pair of photocurrents into a pair of voltage signals; and
an offset canceller including a current extractor configured to receive the voltage signals output from the differential trans-impedance amplifier and to shunt a portion of the photocurrents to cancel an output offset appearing in the voltage signals of the differential trans-impedance amplifier.

2. The optical receiver of claim 1,
wherein the current extractor includes a differential circuit including a pair of transistors and a current source commonly connected to the pair of transistors, and
wherein the differential circuit of the current extractor has a pair of inputs to receive the voltage signals of the differential trans-impedance amplifier and a pair of outputs each connected to respective inputs of the differential trans-impedance amplifier to shunt the portion of the photocurrents input to the differential trans-impedance amplifier.

3. The optical receiver of claim 2,
wherein the differential circuit in the current extractor has an open collector arrangement, each of collectors being connected to respective inputs of the differential trans-impedance amplifier.

4. The optical receiver of claim 2,
wherein the offset canceller further includes an average detector to detect an average of input levels of the differential trans-impedance amplifier, and
wherein the current source in the current extractor receives the average of the input levels to suppress saturation of the differential trans-impedance amplifier.

5. The optical receiver of claim 2,
wherein the optical receiver further includes an average detector to detect a sum of the photocurrents, and
wherein the current source of the differential circuit in the current extractor receives the sum of the photocurrents to suppress saturation of the differential trans-impedance amplifier.

6. The optical receiver of claim 2,
wherein the differential trans-impedance amplifier includes a differential circuit and an emitter follower connected downstream of the differential circuit of the differential trans-impedance amplifier,
wherein the emitter follower is biased by a power supply through a resistor to detect a sum of the photocurrents, and
wherein the current source in the current extractor receives the sum of the photocurrents to suppress saturation of the differential circuit in the differential trans-impedance amplifier.

7. The optical receiver of claim 1, further comprising:
an intermediate amplifier and an output buffer each having a differential arrangement and being connected in series downstream of the differential trans-impedance amplifier,
wherein the offset canceller receives the voltage signals from outputs of the output buffer.

8. The optical receiver of claim 7,
wherein the intermediate amplifier is a limiting amplifier.

9. An amplifier, comprising:
a differential trans-impedance amplifier providing a pair of input terminals and a pair of output terminals; and
an offset canceller providing a pair of input terminals and a pair of output terminals, the input terminals of the offset canceller being connected to respective output terminals of the differential trans-impedance amplifier and the output terminals of the offset canceller being connected to respective input terminals of the differential trans-impedance amplifier,
wherein the offset canceller shunts a portion of currents to each respective input terminal of the differential trans-impedance amplifier to cancel an offset appearing between the output terminals of the differential trans-impedance amplifier.

10. The amplifier of claim 9,
wherein the offset canceller includes a pair of transistors and a current source commonly connected to the paired transistors of the offset canceller, and wherein each of the paired transistors of the offset canceller is connected to respective output terminals of the differential trans-impedance amplifier, and has an open collector output connected to respective output terminals of the offset canceller.

11. The amplifier of claim 10,
wherein the offset canceller further includes an average detector to detect an average of input signals input to the input terminals of the differential trans-impedance amplifier, and wherein the current source of the offset canceller is controlled by the average of the input signals.

12. The amplifier of claim 10,
wherein the offset canceller further includes a current detector to detect a sum of currents input to the input terminals of the differential trans-impedance amplifier, and wherein the current source of the offset canceller is controlled by the sum of the input currents.

13. The amplifier of claim 12,
wherein the differential trans-impedance amplifier provides a differential circuit and an emitter follower each connected to the differential circuit of the differential trans-impedance amplifier and biased by a power supply through a common resistor, and wherein the common resistor operates as the current detector.

* * * * *